United States Patent [19]
Ham

[11] Patent Number: 5,543,255
[45] Date of Patent: Aug. 6, 1996

[54] HALF-TONE TYPE PHASE SHIFT MASK AND METHOD FOR FABRICATION THEREOF

[75] Inventor: Young M. Ham, Kyoungki-do, Rep. of Korea

[73] Assignee: Hyundai Electronics Industries Co., Ltd., Kyoungki-Do, Rep. of Korea

[21] Appl. No.: 382,759

[22] Filed: Feb. 2, 1995

[30] Foreign Application Priority Data

Feb. 3, 1994 [KR] Rep. of Korea .................. 94-1942

[51] Int. Cl.$^6$ ..................................................... G03F 9/00
[52] U.S. Cl. .................. 430/5; 430/311; 430/396
[58] Field of Search .................... 430/5, 311, 396

[56] References Cited

U.S. PATENT DOCUMENTS 5,286,581  2/1994  Lee .............................. 430/311
5,286,584  2/1994  Gemmink et al. .............. 430/311

Primary Examiner—S. Rosasco
Attorney, Agent, or Firm—Popham, Haik, Schnobrich & Kaufman, Ltd.

[57] ABSTRACT

There is disclosed a half-tone type phase shift mask consisting of: a transparent substrate; a phase shift pattern capped with a half-tone type light-penetrating pattern, both patterns being provided with a window exposing a predetermined area of the transparent substrate therethrough and the half-tone type light penetrating pattern having a thickness so that it is penetrated by only 5 to 20% of an incident light; and an optically opaque pattern covering all areas of the transparent substrate except for the phase shift pattern capped with the half-tone type light-penetrating pattern and the window, wherein an incident light penetrates only through the window and the phase shift pattern capped with the half-tone type light-penetrating pattern. The half-tone type phase shift mask is capable of preventing light from penetrating undesired areas and thus capable of obtaining a photoresist pattern with a superior smooth profile.

6 Claims, 3 Drawing Sheets

HALF-TONE TYPE PHASE SHIFT MASK AND METHOD FOR FABRICATION THEREOF

BACKGROUND OF THE INVENTION

1. Field of the Invention

The present invention relates, in general, to a phase shift mask and, more particularly, to a half-tone type phase shift mask capable of preventing light from penetrating undesired areas and thus capable of obtaining a photoresist pattern with a superior smooth profile. The present invention is also related to a method for fabricating the half-tone type phase shift mask.

2. Description of the Prior Art

To achieve the recent trend of high integration in semiconductor devices, it has been required that wires be reduced in size and in the distance therebetween, and that unit elements, such as transistors and capacitors, become smaller. As a result, the patterns formed become finer, while the number of steps involved in fabricating highly integrated semiconductors has in general increased.

In conducting a typical photolithography process for a semiconductor device, there is employed a mask comprising a transparent substrate, such as quartz, on which optically opaque patterns are formed by coating chrome or aluminum and etching it with ion beam. However, it is difficult to form a fine pattern smaller than light resolution by use of the typical mask. Indeed, it is virtually impossible to obtain fine patterns with a line width of 0.5 µm or less by use of current photoresist and light exposing equipment.

Meanwhile, very highly integrated semiconductor devices, such as 64M or more DRAM, demand fine patterns of 0.4 µm or less. Various efforts have been made to meet such demands. In an effort to develop highly integrated semiconductor devices, phase shift masks were invented. In fact, the ultrafine patterns are accomplished by phase shift masks.

A phase shift mask is comprised broadly of a quartz substrate, optically opaque patterns and a phase shift material layer. The phase shift material layer is formed along with the optically opaque patterns on the quartz substrate, playing a role of shifting a beams of light at an angle of 180°. Such phase shift mask is designed to keep the amplitude of a beam of light illuminated on a wafer constant during light exposure processes and to minimize the exposure caused by interference between a light passing through the phase shift material layer and a light passing through a pattern adjacent to the phase shift material layer, thereby improving the resolution of the photoresist film pattern.

In order to improve the contrast ratio of a light illuminated on a photoresist film, the phase shift material with a refractive index of n is formed in the shift mask in such a thickness as to shift to an angle of 160° to 200° the phase of an incident light with a wavelength of 1. For example, where the incident light is G-line or I-line and the phase shift material is an oxide, nitride or spin-on-glass (hereinafter referred to as "SOG"), the thickness of the phase shift material ranges from 3,400 to 4,000 Angstrom. Such a phase shift mask allows patterns with a width of 0.3 µm or less even when conventional photoresist films and light exposing equipments are employed.

A half-tone type phase shift mask is utilized, for form, inter alia, contact hole patterns, and its process capability has been proven to be better by 50% or more. In methods for the fabrication of semiconductor devices, the half-tone type phase shift mask is especially useful in forming fine contact holes of 64M or more scale.

Now, in order to better understand the background of the present invention, a conventional half-tone phase shift mask will be described in connection with FIGS. 1 and 2.

First, referring to FIG. 1, there is shown a cross section of a conventional phase shift mask. As shown in this figure, the conventional phase shift mask comprises a quartz substrate 11 on which a half-tone type light-penetrating film pattern 13 along with a phase shift film pattern 15 is formed so as to provide a window exposing the quartz substrate 11 therethrough. The half-tone type light-penetrating film pattern 13 is made of chrome or aluminum oxide and has such a thickness so that it is penetrated by about 5 to 20% of an incident light. The phase shift film pattern 15 is made of an oxide, nitride or SOG with a predetermined thickness.

When a light is illuminated on such half-tone type phase shift mask, the intensity of light is maximized at the central area of the window and reduced to zero at the boundary between the window and the pattern. The intensity of light at areas provided with no window, is, although very weak, detected in an amount of about 5 to 20% of that of the incident light. This is attributed to the fact that the light penetrates through the half-tone type light-penetrating film pattern 13. Of course, the intensity of the passing through light is proportional to that from a light source. In addition, the intensity of this light is not constant but different even at the areas in which a window is not provided.

Accordingly, in the case while a positive photoresist film 18 coated on a semiconductor substrate 17 is illuminated by use of a conventional half-tone type phase shift mask, the area of the positive photoresist film 18 which is intended to be patterned becomes illuminated because of the penetration of light through the light screen and thus becomes patterned after development, as shown in FIG. 2. As a result, there is obtained a photoresist film pattern having an uneven surface.

Such photoresist film pattern with the stepped surface is a factor which decreases production yield and reliability of a semiconductor device. For example, when this conventional photoresist film pattern is used as an etch mask or an ion implantation mask, a layer under the mask may be damaged or ions may be implanted into unnecessary areas.

SUMMARY OF THE INVENTION

Therefore, an object of the present invention is to overcome the above problems encountered in the prior art and to provide a half-tone type phase shift mask capable of preventing light from penetrating at undesired areas and thus capable of obtaining a photoresist pattern with a superior smooth profile.

Another object of the present invention is to provide a method for fabricating the half-tone type phase shift mask.

In accordance with an aspect of the present invention, the above object can be accomplished by providing a half-tone type phase shift mask, consisting of: a transparent substrate; a phase shift pattern capped with a half-tone type light-penetrating pattern, both being provided with a window exposing a predetermined area of the transparent substrate therethrough; and an optically opaque pattern covering all areas of the transparent substrate except for the phase shift pattern capped with the half-tone type light-penetrating pattern and the window, wherein an incident light penetrates through the window and the phase shift pattern capped with the half-tone type light-penetrating pattern.

In accordance with another aspect of the present invention, there is provided a method for the fabrication of a half-tone type phase shift mask, comprising the steps of: forming a phase shift layer and a half-tone type light-penetrating layer on a transparent substrate, in sequence; selectively etching the phase shift layer therein, said window exposing a predetermined area of the transparent substrate; depositing a blanket negative photoresist film over the resulting structure; illuminating the negative photoresist film with a light having a larger energy than is necessary for cure of the negative photoresist film, to form a photoresist film pattern covering the window and an edge area of the half-tone type light-penetrating layer, said light being incident from the backside of the transparent substrate; subjecting the half-tone type light-penetrating layer and the phase shift layer to selective etching, to form a half-tone type light-penetrating pattern and a phase shift pattern, both patterns provided with the window, said photoresist film pattern serving as a mask; coating a blanket optically opaque layer over the resulting structure; and removing the photoresist film pattern along with the optically opaque layer covering the photoresist film pattern, to form an optically opaque pattern defining an area to be exposes.

BRIEF DESCRIPTION OF THE DRAWINGS

The above objects and other advantages of the present invention will become more apparent by describing in detail the preferred embodiments of he present invention with reference to the attached drawings in which.

DETAILED DESCRIPTION OF THE PREFERRED EMBODIMENTS the application of the preferred embodiments of the present invention is best understood with reference to the accompanying drawings, wherein like reference numerals are used for like and corresponding parts, respectively.

Figure 1:
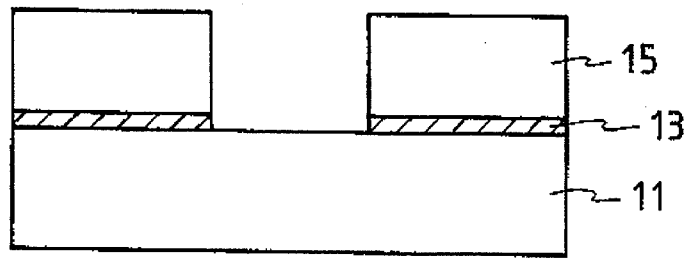
FIG. 1 is a schematic cross sectional view showing a conventional half-tone type phase shift mask.
Figure 2:
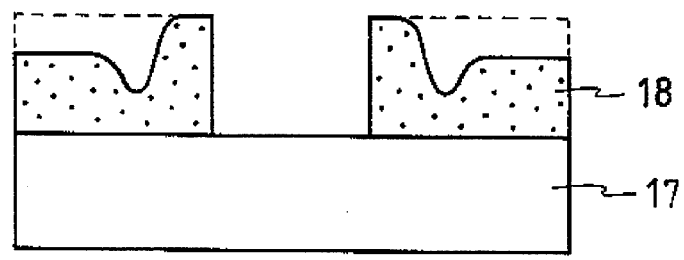
FIG. 2 is a schematic cross sectional view showing a photoresist film pattern on a semiconductor substrate, formed by use of the half-tone type phase shift mask of FIG. 1.
Figure 3:
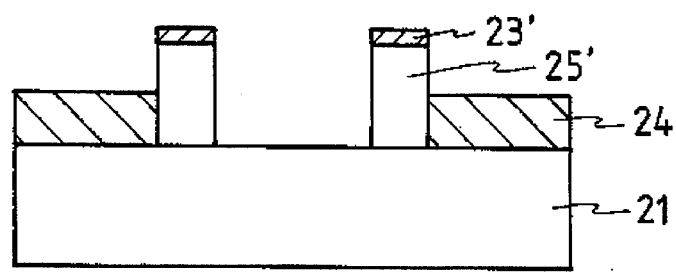
FIG. 3 is a schematic cross sectional view showing a half-tone type phase shift mask according to the present invention.

Referring primarily to FIG. 3, there is shown a half-tone type phase shift mask of the present invention. As shown in this figure, the half-tone type phase shift mask is comprised of a transparent substrate, for example, quartz substrate 21, an optically opaque pattern of, for example, chrome 24 formed on the transparent substrate 21, and a phase shift type pattern 25' capped with a half-tone light-penetrating film pattern 23', said phase shift pattern 25' being beside said optically opaque pattern 24 so as to provide a window exposing a predetermined area of the transparent substrate 21.

While the phase shift pattern 25' is made of a material selected from a group consisting of SOG, oxide and nitride, the half-tone type light-penetrating film pattern 23' is of chrome or aluminum oxide. In accordance with the present invention, the half-tone type light-penetrating film 23 has such a thickness of 100 to 150 Angstrom so that it is penetrated by 5 to 20% of an incident light.

Unlike the conventional phase shift mask, the half-tone type phase shift mask prevents the penetration of light at areas in which the window is absent. Accordingly, when a light exposure process is undertaken with the half-tone type phase shift mask of the present invention, a photoresist film pattern with a smooth surface can be obtained. Consequently, the half-tone type phase shift mask of the present invention is advantageous in forming, inter alia, fine contact holes.

The preferred process steps of the half-tone type phase shift mask of FIG. 3, are as follows. These steps will be generally described in connection with FIGS. 4 through 9.

Figure 4:
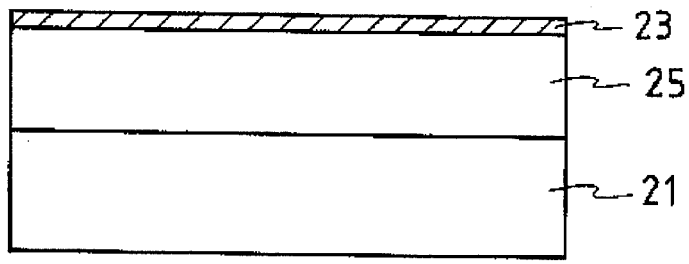
FIGS. 4 through 9 are schematic cross sectional views illustrating a method for the fabrication of a half-tone type phase shift mask, according to the present invention.

First, as shown in FIG. 4, on a transparent substrate 21, for example, quartz substrate, there are formed in sequence a phase shift layer 25 made of oxide, nitride or SOG and a half-tone light-penetrating layer 23 made of chrome or aluminum oxide. The half-tone light-penetrating layer 23 is formed in such a thickness of about 100 to 150 Angstrom so that it is penetrated by 5 to 20% of an incident light.

Figure 5:
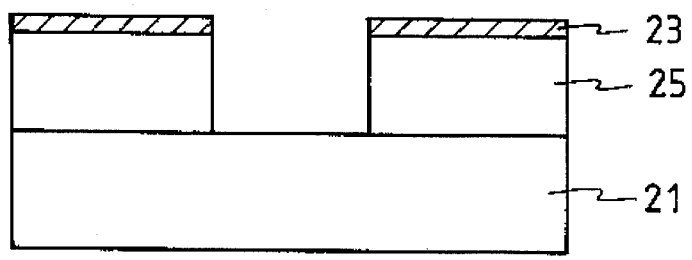

Next, with reference to FIG. 5, the half-tone type light-penetrating layer 23 and the phase shift layer 25 are subjected to ion-beam etch, to form a window which exposes a predetermined area of the transparent substrate 21.

Figure 6:
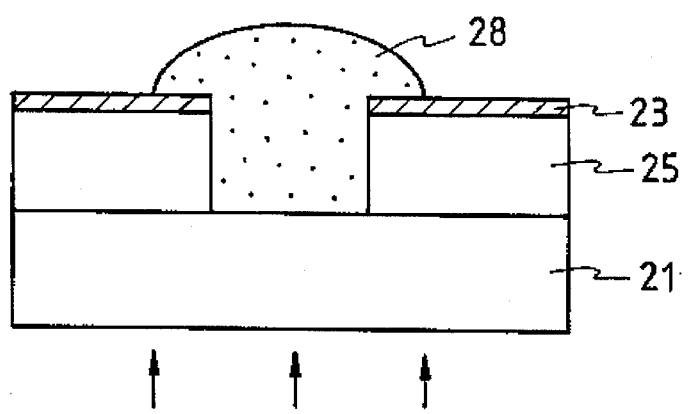

Thereafter, with reference to FIG. 6, a blanket negative photoresist film is coated over the resulting structure of FIG. 5 and then exposes to a beam of light with a larger energy than is necessary for cure of the negative photoresist film, incident from the backside of the transparent substrate 21, and finally developed, to form a photoresist film pattern 28 covering the window and an edge area of the half-tone type light-penetrating layer 23. That is to say, this photolithography utilizes the window as a slit from which the beam is diffracted and employs the remaining phase shift layer 25 and half-tone type light-penetrating layer 23 as a mask. By virtue of the diffraction, the illuminated area of the photoresist film is wider than the window.

Figure 7:
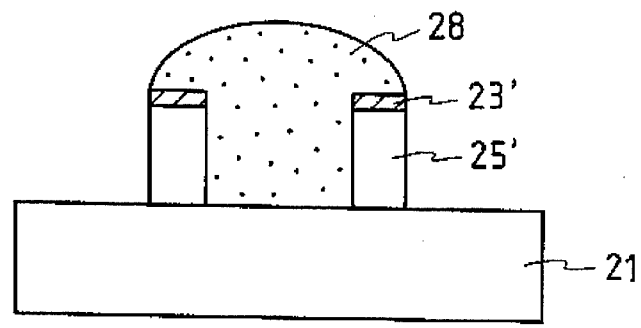
Figure 8:
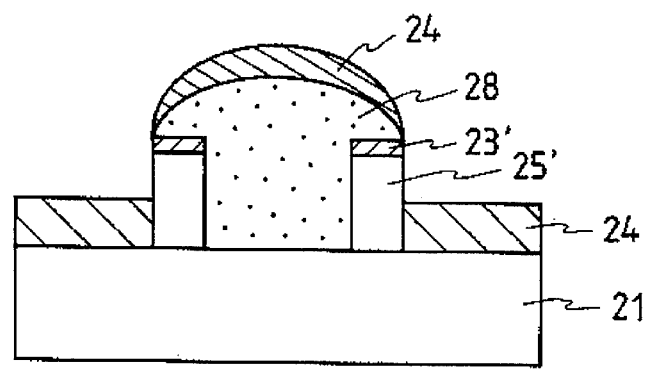

Subsequently, with reference to FIG. 7, the photoresist film pattern 28 is cured by annealing it at a temperature of 130° C. or more with the aim of capacitating it to endure a subsequent etching processing, and an etching process is conducted to form a half-tone type light-penetrating pattern 23' and a phase shift pattern 25' provided with the window, with the photoresist film pattern 28 serving as a mask.

then, with reference to FIG. 8, over the resulting structure, there is deposited chrome or aluminum oxide which is thick enough to screen light, to form an optically opaque layer 24.

Figure 9:
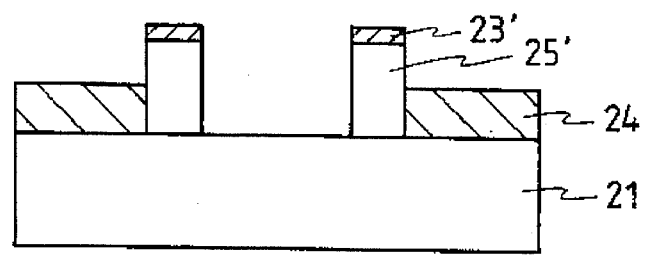

Finally, with reference to FIG. 9, the photoresist film pattern 28 is eliminated in a lift-off manner along with an area of the optically opaque layer 24 covering the photoresist film pattern 28. As a result, an optically opaque layer 24 remains covering all areas of the transparent substrate 21 but the predetermined area to be exposes.

As described hereinbefore, the half-tone type phase shift mask of the present invention which is prepared by a method consisting broadly of forming a phase shift pattern capped with a half-tone type light-penetrating pattern, both provided with a window, on a predetermined area of a transparent substrate and forming an optically opaque pattern covering all the transparent substrate except for the phase shift pattern and the window can reduce the intensity of the passing-through light to zero at areas other than the window and the phase shift pattern.

Therefore, the present invention can sole the problem of exposing undesired area to light, and a photoresist film pattern with a superior profile can be obtained by use of the half-tone type phase shift mask of the present invention. Such photoresist film pattern obtained can be used as a mask for etch or ion implantation, resulting in the prevention of damage to a layer under the mask. Consequently, the half-tone type phase shift mask according to the present invention brings about effects of improving the production yield and the reliability of a semiconductor device.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A half-tone phase shift mask, comprising:

a transparent substrate;

a phase shift pattern formed on a first portion of said transparent substrate;

a half-tone light-penetrating pattern formed on said phase shift pattern, said phase shift and half-tone light-penetrating patterns having a window formed therein so that a second portion of said transparent substrate is exposed; and an optically opaque pattern covering a third portion of said transparent substrate so that an incident light penetrates only through said window and said phase shift and half-tone light-penetrating patterns.

2. A half-tone phase shift mask in accordance with claim 1, wherein said half-tone light-penetrating pattern is made of chrome or aluminum oxide.

3. A half-tone phase shift mask in accordance with claim 1, wherein said half-tone light-penetrating pattern is about 100 to 150 angstrom thick so that about 5 to 20% of an incident light penetrates therethrough.

4. A method for the fabrication of a half-tone phase shift mask, comprising the steps of:

forming a phase shift layer and a half-tone light-penetrating layer on a transparent substrate, in sequence;

selectively etching the phase shift layer and the half-tone light-penetrating layer to form a window therein, so that the window exposes a predetermined area of the transparent substrate;

depositing a blanket negative photoresist film over the resulting structure;

illuminating the negative photoresist film with a light having a larger energy than is necessary for cure of the negative photoresist film, to form a photoresist film pattern covering the window and an edge area of the half-tone light-penetrating layer, the light being incident from the backside of the transparent substrate;

subjecting the half-tone light-penetrating layer and the phase shift layer to selective etching, to form a half-tone light-penetrating pattern and a phase shift pattern, both patterns being provided with the window, so that the phase shift and half-tone light-penetrating patterns are formed over a first portion of the substrate and the window exposes a second portion of the substrate, the photoresist film pattern serving as a mask;

coating a blanket optically opaque layer over the resulting structure; and removing the photoresist film pattern along with the optically opaque layer covering the photoresist film pattern to form an optically opaque pattern over a third portion of the transparent substrate.

5. A method in accordance with claim 4, wherein the photoresist film pattern is annealed at a temperature of about 130° C. or more prior to selectively etching the half-tone light-penetrating and phase shift layers, so that the photoresist film pattern serves as a mask in the selective etching.

6. A method in accordance with claim 4, wherein said half-tone light-penetrating pattern is formed about 100 to 150 Angstrom thick so that about 5 to 20% of the incident light penetrates therethrough.

* * * * *